US012784798B2

(12) United States Patent
Chang et al.

(10) Patent No.: US 12,784,798 B2
(45) Date of Patent: Nov. 3, 2026

(54) MAGNETORESISTIVE RANDOM ACCESS MEMORY SYSTEM WITH SOURCE LINE AND BIT LINE COMPENSATION VOLTAGES

(71) Applicant: UNITED MICROELECTRONICS CORP., Hsin-Chu City (TW)

(72) Inventors: Ting-Hao Chang, Kaohsiung City (TW); Chien-Yu Ko, Tainan City (TW); Cheng-Tung Huang, Kaohsiung City (TW); Wen-Liang Huang, Taoyuan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 111 days.

(21) Appl. No.: 18/898,707

(22) Filed: Sep. 27, 2024

(65) Prior Publication Data

US 2026/0065965 A1 Mar. 5, 2026

(30) Foreign Application Priority Data

Sep. 5, 2024 (TW) ................................ 113133579

(51) Int. Cl.
*G11C 11/16* (2006.01)

(52) U.S. Cl.
CPC ...... *G11C 11/1675* (2013.01); *G11C 11/1655* (2013.01); *G11C 11/1657* (2013.01)

(58) Field of Classification Search
CPC ............ G11C 11/1675; G11C 11/1655; G11C 11/1657
See application file for complete search history.

(56) References Cited

U.S. PATENT DOCUMENTS 9,036,406 B2 * 5/2015 Kim .................... G11C 11/1697 365/158
9,349,438 B2 * 5/2016 Sano ........................ G11C 7/12
10,374,006 B1 8/2019 Chu
10,510,392 B1 * 12/2019 Paul .................... G11C 11/1675
10,651,235 B1 5/2020 Wu
10,658,022 B1 * 5/2020 Maffitt ................... G11C 7/067
(Continued)

FOREIGN PATENT DOCUMENTS

TW 201732812 9/2017
WO 2017/176217 A1 10/2017

*Primary Examiner* — B. James Peikari
(74) *Attorney, Agent, or Firm* — Winston Hsu

(57) ABSTRACT

A data writing capability enhancement system includes a magnetoresistive random access memory array, a first driving circuit, a second driving circuit, and an enhancement circuit. The first driving circuit is coupled to the magnetoresistive random access memory array and configured to provide a plurality of word line voltages to the magnetoresistive random access memory array. The second driving circuit is coupled to one side of the magnetoresistive random access memory array and configured to provide a plurality of source line voltages and a plurality of bit line voltages to the side of the magnetoresistive random access memory array. The enhancement circuit is coupled to another side of the magnetoresistive random access memory array and configured to provide a plurality of source line compensation voltages and a plurality of bit line compensation voltages to the another side of the magnetoresistive random access memory array.

20 Claims, 9 Drawing Sheets

(56) References Cited

U.S. PATENT DOCUMENTS

| | | | | |
|---|---|---|---|---|
| 10,706,914 | B2 | 7/2020 | Tseng | |
| 10,978,122 | B1 | 4/2021 | Tseng | |
| 10,984,872 | B1 * | 4/2021 | Jin | G11C 16/10 |
| 11,011,210 | B2 * | 5/2021 | Hsu | G11C 11/1653 |
| 11,018,185 | B1 | 5/2021 | Wu | |
| 11,087,812 | B1 | 8/2021 | Lee | |
| 11,222,677 | B1 * | 1/2022 | Tung | G11C 11/1657 |
| 11,238,912 | B1 | 2/2022 | Wu | |
| 2008/0308885 | A1 | 12/2008 | Lu | |
| 2010/0072530 | A1 | 3/2010 | Takizawa | |
| 2014/0211549 | A1 * | 7/2014 | Lin | G11C 11/1675<br>365/158 |
| 2019/0198078 | A1 * | 6/2019 | Hoang | G11C 11/161 |
| 2021/0065750 | A1 | 3/2021 | Hsu | |
| 2021/0225414 | A1 * | 7/2021 | Hsu | G11C 11/1655 |
| 2022/0084591 | A1 * | 3/2022 | Kim | G11C 11/1675 |
| 2022/0384523 | A1 | 12/2022 | Wu | |
| 2023/0020262 | A1 * | 1/2023 | Kang | G11C 11/1655 |
| 2024/0032441 | A1 | 1/2024 | Kuo | |
| 2024/0274183 | A1 | 8/2024 | Bolandrina | |
| 2024/0422988 | A1 | 12/2024 | Huang | |
| 2025/0120094 | A1 | 4/2025 | Chen | |
| 2025/0227938 | A1 | 7/2025 | Lin | |
| 2025/0356895 | A1 | 11/2025 | Chang | |
| 2025/0374554 | A1 | 12/2025 | Chang | |

* cited by examiner

MAGNETORESISTIVE RANDOM ACCESS MEMORY SYSTEM WITH SOURCE LINE AND BIT LINE COMPENSATION VOLTAGES

BACKGROUND OF THE INVENTION

1. Field of the Invention

The present invention relates to a data writing capability enhancement system, and more particularly, a data writing capability enhancement system capable of reducing equivalent resistance and mitigating write voltage degradation of memory.

2. Description of the Prior Art

Magnetoresistive Random Access Memory (MRAM) is a new type of non-volatile memory composed of a large number of Magnetic Tunnel Junctions (MTJs). An MTJ is a three-layer structure composed of two ferromagnetic layers separated by an insulating layer. Its resistance varies depending on the relative magnetization directions of the two ferromagnetic layers. MRAM has the advantages of non-volatility, high speed, high durability, and low power consumption. Therefore, it is gradually applied in flash memory, Dynamic Random Access Memory (DRAM), and Static Random Access Memory (SRAM). Moreover, the read/write operations of MTJs are achieved by measuring their resistances.

In conventional MRAM driving mechanisms, when a write voltage is applied to one side of the MRAM array, the internal resistance of the bit lines and source lines accumulates with their length. This accumulation reduces the write capability of some memory cells. Furthermore, the increased internal resistance raises the required write voltage for the memory cells, which in turn reduces the write operation margin of the memory cells at low temperatures.

Therefore, developing a system capable of reducing the equivalent resistance to mitigate write voltage degradation and enhance data writing capability is an important design issue.

SUMMARY OF THE INVENTION

In an embodiment of the present invention, a data writing capability enhancement system is disclosed. The data writing capability enhancement system comprises a magnetoresistive random access, a first driving circuit, a second driving circuit, and an enhancement circuit. The first driving circuit is coupled to the magnetoresistive random access memory array and configured to provide a plurality of word line voltages to the magnetoresistive random access memory array. The second driving circuit is coupled to one side of the magnetoresistive random access memory array and configured to provide a plurality of source line voltages and a plurality of bit line voltages to the side of the magnetoresistive random access memory array. The enhancement circuit is coupled to another side of the magnetoresistive random access memory array and configured to provide a plurality of source line compensation voltages and a plurality of bit line compensation voltages to the another side of the magnetoresistive random access memory array.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
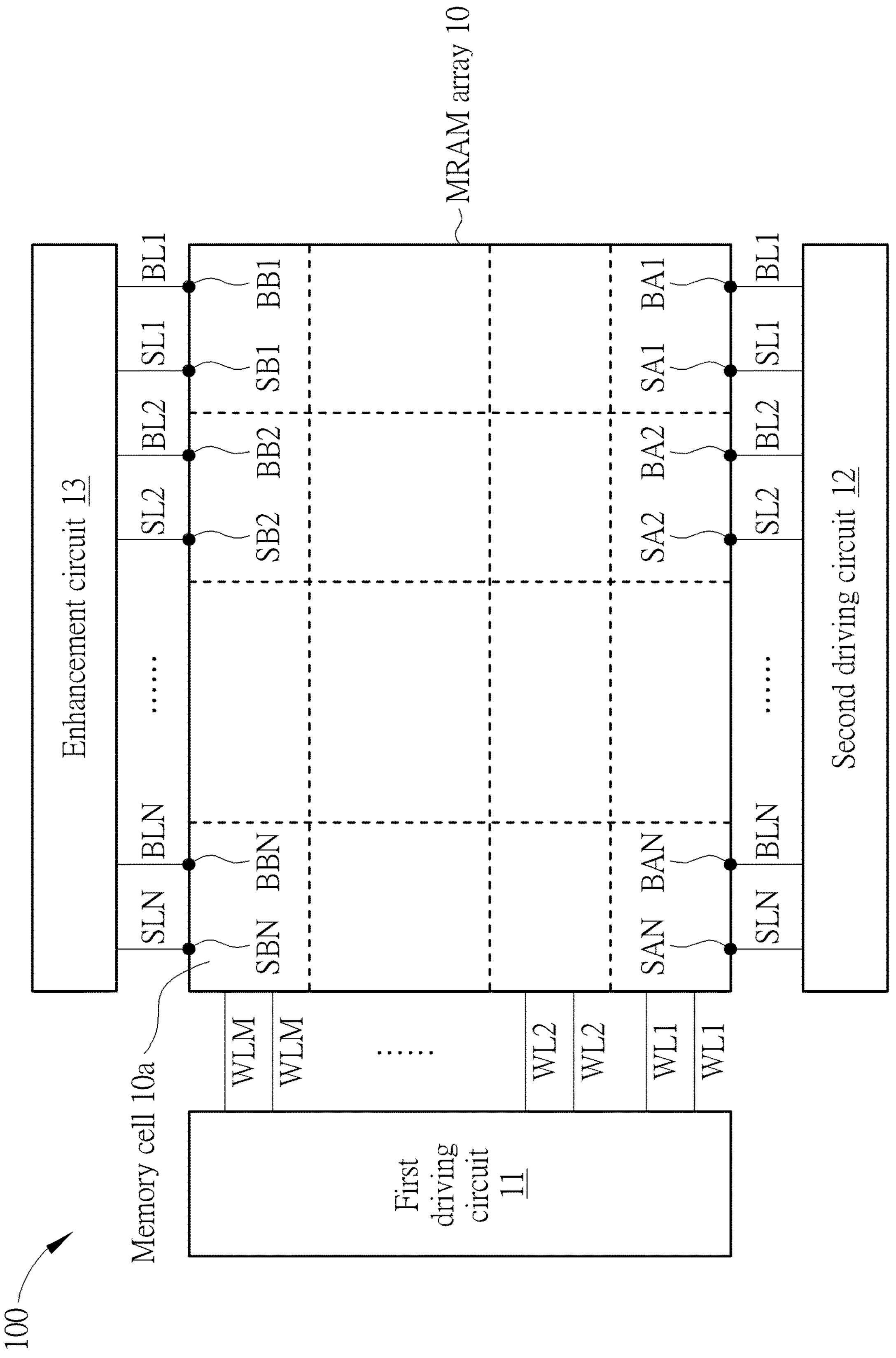
FIG. 1 is a block diagram a data writing capability enhancement system according to an embodiment of the present invention.

FIG. 1 is a block diagram a data writing capability enhancement system 100 according to an embodiment of the present invention. The data writing capability enhancement system 100 can improve the write efficiency of the Magnetoresistive Random Access Memory (MRAM). However, it should be understood that the principles and concepts of the data writing capability enhancement system 100 can also be applied to any memory architecture. Therefore, the present invention is not limited to the application of MRAM. For ease of understanding, the following contents still use the application of MRAM for describing the data writing capability enhancement system 100. In FIG. 1, the data writing capability enhancement system 100 includes an MRAM array 10, a first driving circuit 11, a second driving circuit 12, and an enhancement circuit 13. The MRAM array 10 may include a plurality of memory cells 10*a*. For example, a dimension of the MRAM array 10 may be M×N. The MRAM array 10 can include M×N memory cells 10*a*. M and N are positive integers. The first driving circuit 11 is coupled to the MRAM array 10 for providing a plurality of word line voltages to the MRAM array 10. For example, the first driving circuit 11 can input the word line voltages to the MRAM array 10 through a plurality of word lines WL1 to WLM. The second driving circuit 12 is coupled to one side of the MRAM array 10 for providing a plurality of source line voltages and a plurality of bit line voltages to the side of the MRAM array 10. For example, the second driving circuit 12 is coupled to a lower side of the MRAM array 10, and inputs the source line voltages to the lower side of the MRAM array 10 through a plurality of source lines SL1 to SLN. Furthermore, the second driving circuit 12 inputs the bit line voltages to the lower side of the MRAM array 10 through a plurality of bit lines BL1 to BLN. The enhancement circuit 13 is coupled to another side of the MRAM array 10 for providing a plurality of source line compensation voltages and a plurality of bit line compensation voltages to the another side of the MRAM array 10. For example, the enhancement circuit 13 is coupled to an upper side of the MRAM array 10, and inputs the source line compensation voltages to the upper side of the MRAM array 10 through the plurality of source lines SL1 to SLN. The enhancement circuit 13 inputs the bit line compensation voltages to the upper side of the MRAM array 10 through the plurality of bit lines BL1 to BLN.

In other words, in the data writing capability enhancement system 100, the MRAM array 10 includes the word lines WL1 to WLM, the source lines SL1 to SLN, and the bit lines BL1 to BLN. The word lines WL1 to WLM are used for receiving the word line voltages generated by the first driving circuit 11. First source line terminals SA1 to SAN at a first side of the source lines SL1 to SLN are used for receiving the source line voltages generated by the second driving circuit 12. Furthermore, first bit line terminals BA1 to BAN at the first side of the bit lines BL1 to BLN are used for receiving the bit line voltages generated by the second driving circuit 12. Since the data writing capability enhancement system 100 introduces the enhancement circuit 13, second source line terminals SB1 to SBN at a second side of the source lines SL1 to SLN can be used for receiving the source line compensation voltages generated by the enhancement circuit 13. Similarly, second bit line terminals BB1 to BBN at the second side of the bit lines BL1 to BLN can be used for receiving the bit line compensation voltages generated by the enhancement circuit 13.

As previously mentioned, the MRAM array 10 may include a plurality of memory cells 10*a*. Furthermore, since the source line voltages and the source line compensation voltages can be inputted from terminals of two sides of the source lines, each of the memory cells can receive the source line voltage and the source line compensation voltage through the source lines. Similarly, since the bit line voltages and the bit line compensation voltages can be inputted from terminals of two sides of the bit lines, each of the memory cells can receive the bit line voltage and the bit line compensation voltage through the bit lines.

Figure 2:
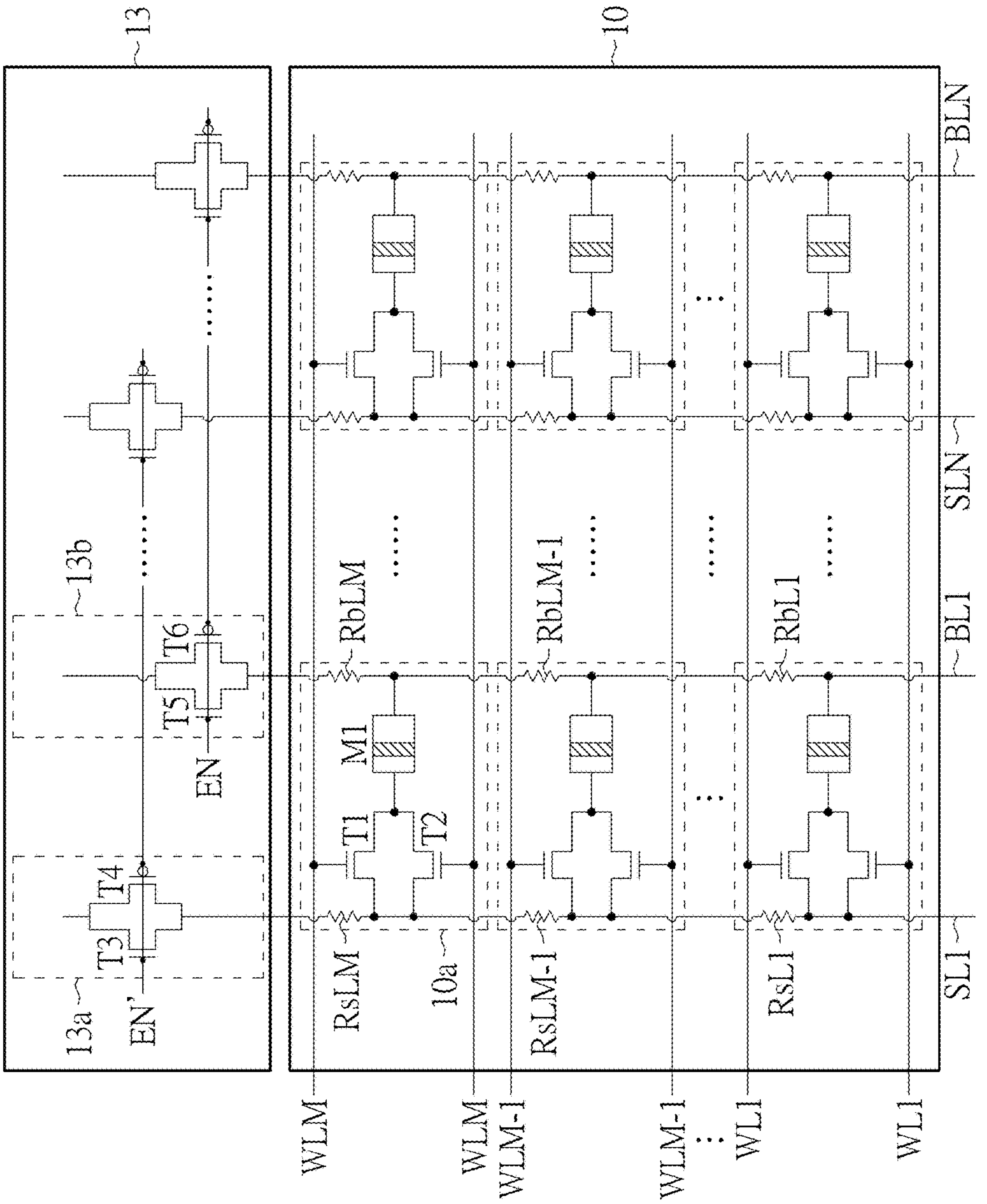
FIG. 2 illustrates a structure of a magnetoresistive random access memory array and an enhancement circuit of the data writing capability enhancement system in FIG. 1.

FIG. 2 illustrates a structure of the MRAM array 10 and the enhancement circuit 13 of the data writing capability enhancement system 100. Each memory cell 10*a* in the MRAM array 10 may be a 2-Transistor/1-MTJ (Magnetic Tunnel Junction) component (abbreviated as 2T/1M) structure, as illustrated below. Each memory cell 10*a* may include a first transistor T1, a second transistor T2, and an MTJ component M1. For simplicity, the (M,1)-th memory cell 10*a* is introduced for illustrating the memory cell structure. In the (M,1)-th memory cell 10*a*, the first transistor T1 includes a first terminal coupled to a source line SL1, a second terminal, and a control terminal coupled to a word line WLM. The second transistor T2 includes a first terminal coupled to the source line SL1, a second terminal coupled to the second terminal of the first transistor T1, and a control terminal coupled to the word line WLM. The MTJ component M1 includes a first terminal coupled to the second terminal of the second transistor T2, and a second terminal coupled to a bit line BL1. The first transistor T1 and the second transistor T2 are N-type Metal Oxide Semiconductor Field Effect Transistors (MOSFETs). Since the memory cell 10*a* is the 2T/1M structure, each memory cell corresponds to two word lines, one source line, and one bit line. For example, when the MRAM array 10 includes M×N memory cells, the (1,1)-th memory cell corresponds to two word lines WL1, the source line SL1, and the bit line BL1. The (2,1)-th memory cell corresponds to two word lines WL2, the source line SL1, and the bit line BL1, and so on, the (M,N)-th memory cell corresponds to two word lines WLM, the source line SLN, and the bit line BLN.

In the data writing capability enhancement system 100, the enhancement circuit 13 includes a plurality of source line enhancement units 13*a* and a plurality of bit line enhancement units 13*b*. Each source line enhancement unit 13*a* is coupled to a corresponding source line. Each bit line enhancement unit 13*b* is coupled to a corresponding bit line.

The structural details of the source line enhancement units 13*a* and the bit line enhancement units 13*b* are illustrated below with reference to FIG.3A and FIG.4A.

It should be understood that each source line and each bit line has its internal resistance. For example, in FIG. 2, it is assumed that M memory cells in a column are introduced. The internal resistance of the source line SL1 in the column may include source line internal resistances RsL1 to RsLM. The internal resistance of the bit line BL1 in the column may include bit line internal resistances RbL1 to RbLM. Excessive internal resistance will cause IR drop, which will affect the write efficiency of the memory. In the following, configuration details of the enhancement circuit 13 and the principle of reducing equivalent internal resistance for various write states of the memory cell 10*a* are illustrated.

Figure 3A:
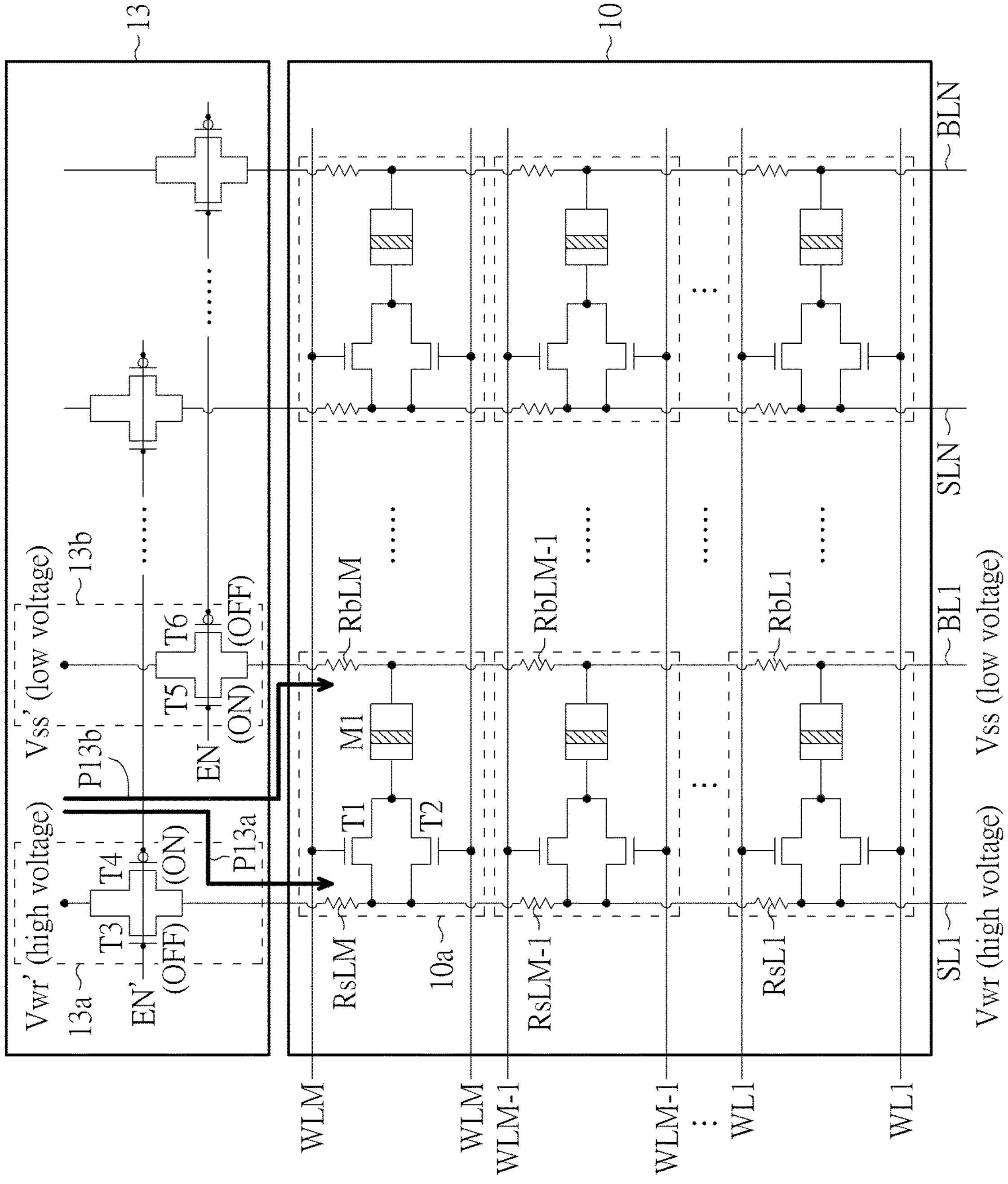
FIG. 3A is an illustration of configurations of the enhancement circuit of the data writing capability enhancement system in FIG. 1 when a memory cell is operated under a first write state.

FIG. 3A is an illustration of configurations of the enhancement circuit 13 of the data writing capability enhancement system 100 when a memory cell 10*a* is operated under a first write state. In the data writing capability enhancement system 100, the memory cell 10*a* can be operated under the first write state, also called as a Write to High (W2H) state. In the enhancement circuit 13, each source line enhancement unit 13*a* includes a third transistor T3 and a fourth transistor T4. The third transistor T3 includes a first terminal for receiving a source line compensation voltage, a second terminal coupled to a source line, and a control terminal for receiving an inverted enabling signal EN'. The fourth transistor T4 includes a first terminal coupled to the first terminal of the third transistor T3, a second terminal coupled to the second terminal of the third transistor T3, and a control terminal for receiving the inverted enabling signal EN'. The third transistor T3 is an N-type MOSFET, and the fourth transistor T4 is a P-type MOSFET. Furthermore, each bit line enhancement unit 13*b* includes a fifth transistor T5 and a sixth transistor T6. The fifth transistor T5 includes a first terminal for receiving a bit line compensation voltage, a second terminal coupled to a bit line, and a control terminal for receiving an enabling signal EN. The sixth transistor T6 includes a first terminal coupled to the first terminal of the fifth transistor T5, a second terminal coupled to the second terminal of the fifth transistor T5, and a control terminal for receiving the enabling signal EN. The fifth transistor T5 is an N-type MOSFET, and the sixth transistor T6 is a P-type MOSFET. In this state, in the enhancement circuit 13, the inverted enabling signal EN' is at a low voltage. Therefore, the fourth transistor T4 is turned on. The third transistor T3 is turned off. The source line compensation voltage is a high voltage Vwr', and is transmitted to one terminal of the source line in the memory cell 10*a* through the fourth transistor T4. Therefore, for the source line enhancement unit 13*a*, the high voltage Vwr' is transmitted to one terminal of the source line through the path P13*a*. Furthermore, since the fourth transistor T4 is a P-type MOSFET, it has better conductivity when receiving a high voltage. In the first write state, another terminal of the source line in the memory cell 10*a* receives the source line voltage, which is a high voltage Vwr generated by the second driving circuit 12. In one embodiment, the source line compensation voltage and the source line voltage are the same, that is, Vwr'=Vwr.

For the bit line enhancement unit 13*b*, the enabling signal EN is at a high voltage. Therefore, the fifth transistor T5 is turned on. The sixth transistor T6 is turned off. The bit line compensation voltage is a low voltage Vss', and is transmitted to one terminal of the bit line in the memory cell 10*a* through the fifth transistor T5. Therefore, for the bit line enhancement unit 13*b*, the low voltage Vss'is transmitted to one terminal of the bit line through the path P13*b*. In the first write state, another terminal of the bit line in the memory cell 10*a* receives the bit line voltage, which is a low voltage Vss generated by the second driving circuit 12. Similarly, in one embodiment, the bit line compensation voltage and the bit line voltage are the same, that is, Vss'=Vss.

By using aforementioned configurations, the source line voltage and the source line compensation voltage of the memory cell 10*a* are high voltages (i.e., Vwr'=Vwr). Moreover, the bit line voltage and the bit line compensation voltage of the memory cell 10*a* are low voltages (i.e., Vss'=Vss). The memory cell 10*a* is operated in the first write state, which is called as the W2H state.

Figure 3B:
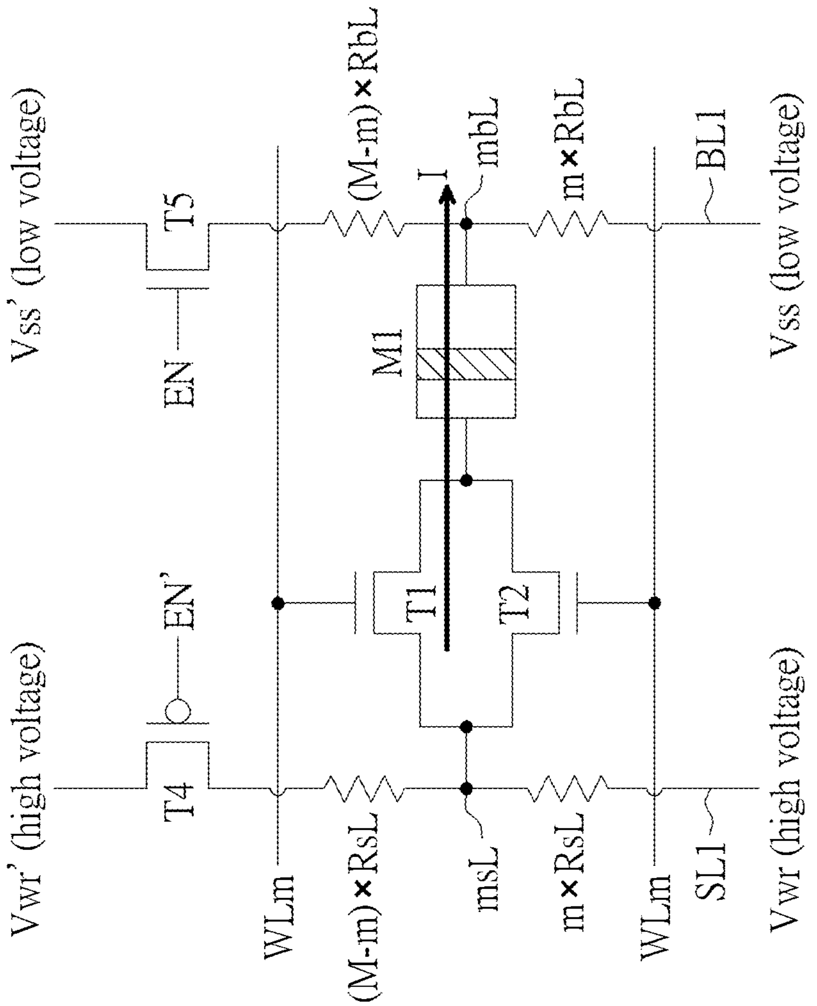
FIG. 3B is an illustration of an equivalent circuit structure of the data writing capability enhancement system in FIG. 3A when the memory cell is operated under the first write state.

FIG. 3B is an illustration of an equivalent circuit structure of the data writing capability enhancement system 100 when the memory cell is operated under the first write state. As previously mentioned, in the first write state, the fourth transistor T4 is turned on. The third transistor T3 is turned off. The fifth transistor T5 is turned on. The sixth transistor T6 is turned off. Therefore, the third transistor T3 and the sixth transistor T6 are open circuits. Thus, they are omitted in FIG. 3B. Moreover, the internal resistance of the source line SL1 in the column may include source line internal resistances RsL1 to RsLM. The internal resistance of the bit line BL1 in the column may include bit line internal resistances RbL1 to RbLM. Therefore, for a source line node msL, the equivalent source line resistance between the source line node msL and the terminal of the source line compensation voltage (high voltage Vwr') is equal to (M−m)×RsL, hereinafter referred to as a first equivalent source line resistance (M−m)×RsL. The first equivalent source line resistance (M−m)×RsL is equivalent the source line internal resistances of M−m memory cells coupled in series. Furthermore, the equivalent source line resistance between the source line node msL and the terminal of the source line voltage (high voltage Vwr) is equal to m×RsL, hereinafter referred to as the second equivalent source line resistance m×RsL. The second equivalent source line resistance m×RsL is equivalent to the source line internal resistances of m memory cells coupled in series. In particular, since the source line compensation voltage (high voltage Vwr') provided by the enhancement unit 13*b* is equal to the source line voltage (high voltage Vwr) provided by the second driving circuit 12, the first equivalent source line resistance (M−m)×RsL and the second equivalent source line resistance m×RsL at the source line node msL are coupled in parallel. Therefore, the equivalent resistance value between the source line node msL and both terminals of the source line can be effectively reduced. In other words, when operating in the first write state, the equivalent source line resistance of each source line at any source line node is smaller than a total equivalent source line resistance M×RsL of a plurality of memory cells (i.e., such as M memory cells) on the row of the MRAM array 10.

For the bit line node mbL, the equivalent bit line resistance between the bit line node mbL and the terminal of bit line compensation voltage (low voltage Vss') is equal to (M−m)×RbL, hereinafter referred to as a first equivalent bit line resistance (M−m)×RbL. The first equivalent bit line resistance (M−m)×RbL is equivalent to the bit line internal resistances of M−m memory cells coupled in series. Furthermore, the equivalent bit line resistance between the bit line node mbL and the terminal of bit line voltage (low voltage Vss) is equal to m×RbL, hereinafter referred to as a second equivalent bit line resistance m×RbL. The second equivalent bit line resistance m×RbL is equivalent to the bit line internal resistances of m memory cells coupled in series. In particular, since the bit line compensation voltage (low voltage Vss') provided by the enhancement unit 13*b* is equal to the bit line voltage (low voltage Vss) provided by the second driving circuit 12, the first equivalent bit line resistance (M−m)×RbL and the second equivalent bit line internal resistance m×RbL at the bit line node mbL are coupled in parallel. Therefore, the equivalent resistance value between the bit line node mbL and both terminals of the bit line can be effectively reduced. In other words, when operating in the first write state, the equivalent bit line resistance of each bit line at any bit line node is smaller than a total equivalent bit line resistance M×RbL of a plurality of memory cells (i.e., such as M memory cells) on the row of the MRAM array 10.

Furthermore, in the first write state (W2H), when the source line voltage and the source line compensation voltage are high voltages (Vwr'=Vwr) and the bit line voltage and the bit line compensation voltage are low voltages (Vss'=Vss), the current I can be transmitted from the source line SL1 to the second terminal of the MTJ component M1 through the first terminal of the MTJ component M1.

Figure 4A:
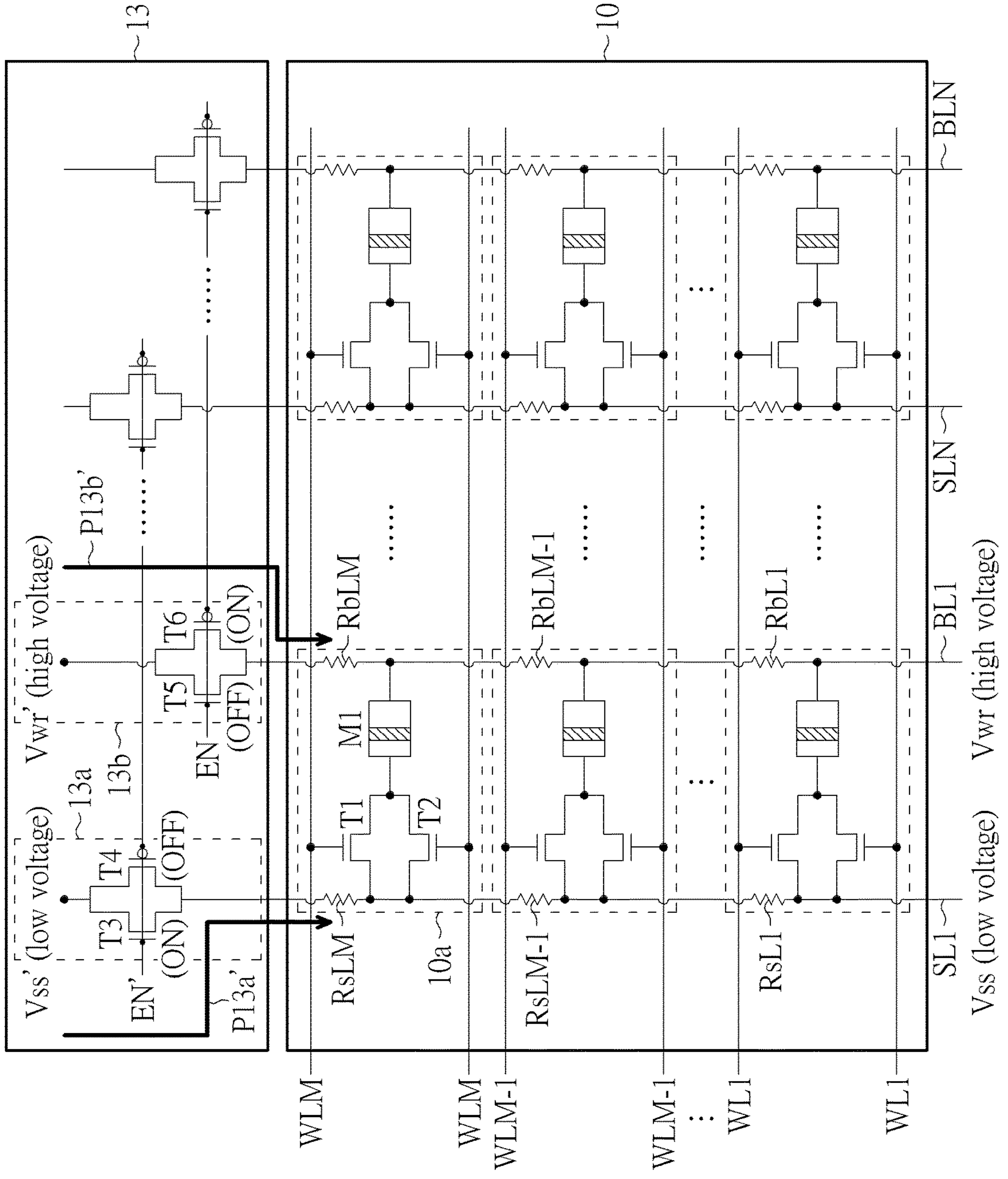
FIG. 4A is an illustration of configurations of the enhancement circuit of the data writing capability enhancement system in FIG. 1 when a memory cell is operated under a second write state.

FIG. 4A is an illustration of configurations of the enhancement circuit 13 of the data writing capability enhancement system 100 when a memory cell 10*a* is operated under a second write state. In the data writing capability enhancement system 100, the memory cell 10*a* can be operated under the second write state, also called as a Write to Low (W2L) state. The structures of the source line enhancement units 13*a* and the bit line enhancement units 13*b* have been described above with reference to FIG.3A, and therefore are not repeated herein. In this state, in the enhancement circuit 13, the inverted enabling signal EN' is at a high voltage. Therefore, the fourth transistor T4 is turned off. The third transistor T3 is turned on. The source line compensation voltage is a low voltage Vss', and is transmitted to one terminal of the source line in the memory cell 10*a* through the third transistor T3. Therefore, for the source line enhancement unit 13*a*, the low voltage Vss' is transmitted to one terminal of the source line through the path P13*a*'. In the second write state, another terminal of the source line in the memory cell 10*a* receives the source line voltage, which is a low voltage Vss generated by the second driving circuit 12. In one embodiment, the source line compensation voltage and the source line voltage are the same, that is, Vss'=Vss.

For the bit line enhancement unit 13*b*, the enabling signal EN is at a low voltage. Therefore, the fifth transistor T5 is turned off. The sixth transistor T6 is turned on. The bit line compensation voltage is a high voltage Vwr', and is transmitted to one terminal of the bit line in the memory cell 10*a* through the sixth transistor T6. Therefore, for the bit line enhancement unit 13*b*, the high voltage Vwr' is transmitted to one terminal of the bit line through the path P13*b*'. Furthermore, since the sixth transistor T6 is a P-type MOSFET, it has better conductivity when receiving a high voltage. In the second write state, another terminal of the bit line in the memory cell 10*a* receives the bit line voltage, which is a high voltage Vwr generated by the second driving circuit 12. Similarly, in one embodiment, the bit line compensation voltage and the bit line voltage are the same, that is, Vwr'=Vwr.

By using aforementioned configurations, the source line voltage and the source line compensation voltage of the memory cell 10*a* are low voltages (i.e., Vss'=Vss). Moreover, the bit line voltage and the bit line compensation voltage of the memory cell 10*a* are high voltages (i.e., Vwr'=Vwr). The memory cell 10*a* is operated in the second write state, which is called as the W2L state.

Figure 4B:
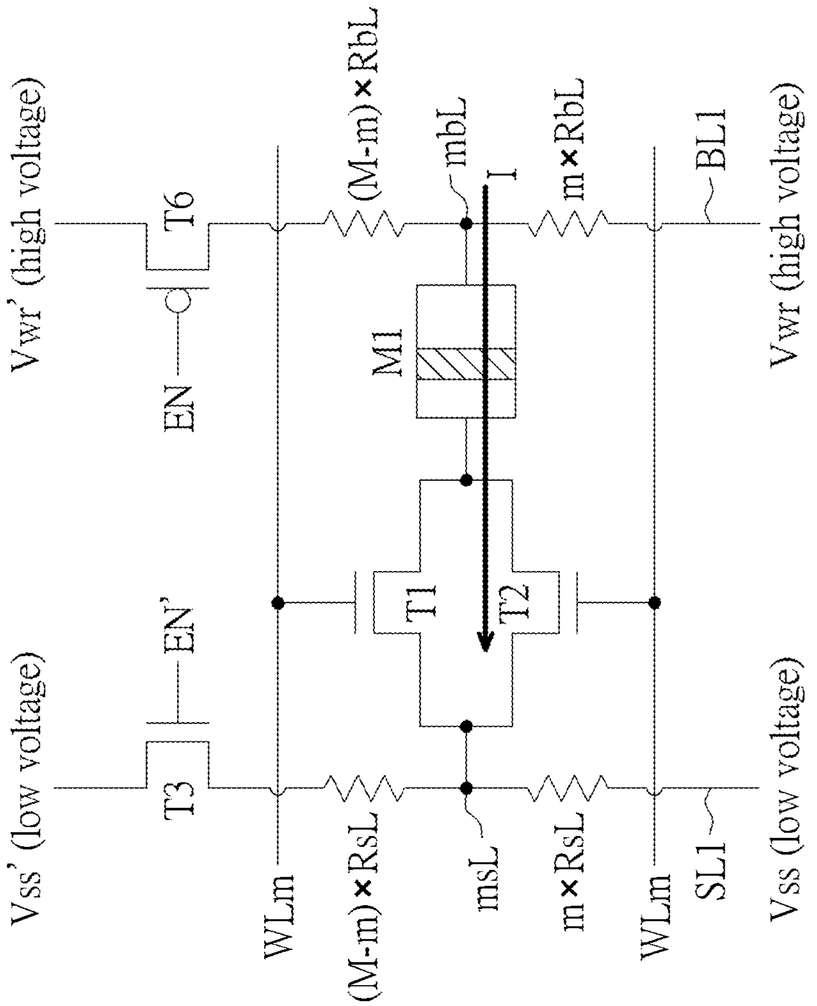
FIG. 4B is an illustration of an equivalent circuit structure of the data writing capability enhancement system in FIG. 4A when the memory cell is operated under the second write state.

FIG. 4B is an illustration of an equivalent circuit structure of the data writing capability enhancement system 100 when the memory cell 10*a* is operated under the second write state. As previously mentioned, in the second write state, the fourth transistor T4 is turned off. The third transistor T3 is turned on. The fifth transistor T5 is turned off. The sixth transistor T6 is turned on. Therefore, the fourth transistor T4 and the fifth transistor T5 are open circuits. Thus, they are omitted in FIG. 4B. Moreover, for the source line node msL, the equivalent source line resistance between the source line node msL and the terminal of the source line compensation voltage (low voltage Vss') is equal to (M−m)×RsL, hereinafter referred to as a first equivalent source line resistance (M−m)×RsL. The first equivalent source line resistance (M−m)×RsL is equivalent the source line internal resistances of M−m memory cells coupled in series. Furthermore, the equivalent source line resistance between the source line node msL and the terminal of the source line voltage (low voltage Vss) is equal to m×RsL, hereinafter referred to as the second equivalent source line resistance m×RsL. The second equivalent source line resistance m×RsL is equivalent to the source line internal resistances of m memory cells coupled in series. In particular, since the source line compensation voltage (low voltage Vss') provided by the enhancement unit 13*b* is equal to the source line voltage (low voltage Vss) provided by the second driving circuit 12, the first equivalent source line resistance (M−m)×RsL and the second equivalent source line resistance m×RsL at the source line node msL are coupled in parallel. Therefore, the equivalent resistance value between the source line node msL and both terminals of the source line can be effectively reduced. In other words, when operating in the second write state, the equivalent source line resistance of each source line at any source line node is smaller than a total equivalent source line resistance M×RsL of a plurality of memory cells (i.e., such as M memory cells) on the row of the MRAM array 10.

For the bit line node mbL, the equivalent bit line resistance between the bit line node mbL and the terminal of bit line compensation voltage (low voltage Vwr') is equal to (M−m)×RbL, hereinafter referred to as a first equivalent bit line resistance (M−m)×RbL. The first equivalent bit line resistance (M−m)×RbL is equivalent to the bit line internal resistances of M−m memory cells coupled in series. Furthermore, the equivalent bit line resistance between the bit line node mbL and the terminal of bit line voltage (high voltage Vwr) is equal to m×RbL, hereinafter referred to as a second equivalent bit line resistance m×RbL. The second equivalent bit line resistance m×RbL is equivalent to the bit line internal resistances of m memory cells coupled in series. In particular, since the bit line compensation voltage (high voltage Vwr') provided by the enhancement unit 13*b* is equal to the bit line voltage (high voltage Vwr) provided by the second driving circuit 12, the first equivalent bit line resistance (M−m)×RbL and the second equivalent bit line internal resistance m×RbL at the bit line node mbL are coupled in parallel. Therefore, the equivalent resistance value between the bit line node mbL and both terminals of the bit line can be effectively reduced. In other words, when operating in the second write state, the equivalent bit line resistance of each bit line at any bit line node is smaller than a total equivalent bit line resistance M×RbL of a plurality of memory cells (i.e., such as M memory cells) on the row of the MRAM array 10.

Furthermore, in the second write state (W2L), when the source line voltage and the source line compensation voltage are low voltages (Vss'=Vss) and the bit line voltage and the bit line compensation voltage are high voltages (Vwr'=Vwr), the current I can be transmitted from the bit line BL1 to the first terminal of the MTJ component M1 through the second terminal of the MTJ component M1.

Figure 5:
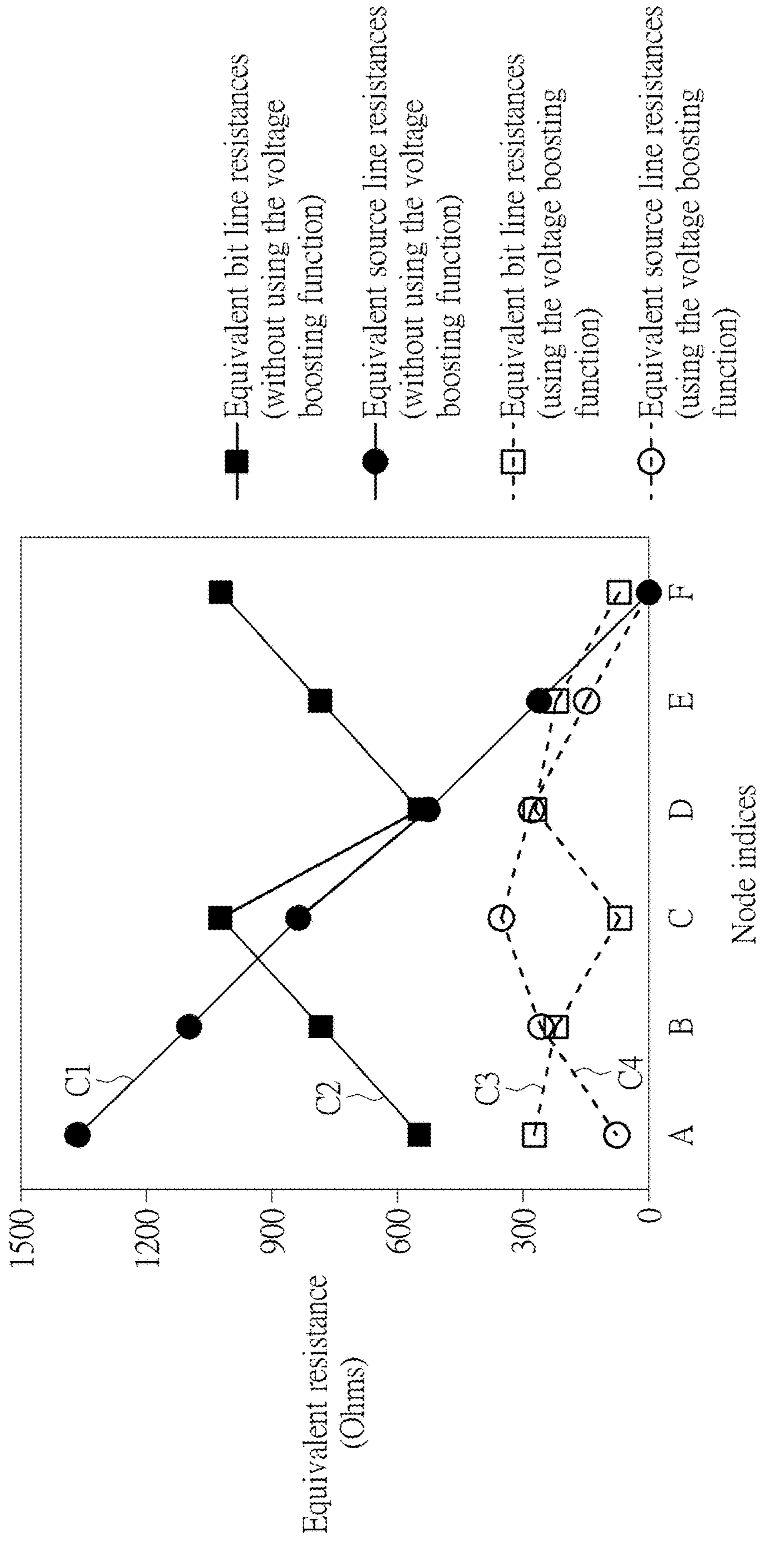
FIG. 5 is a simulation result of equivalent resistance values under different modes of the data writing capability enhancement system in FIG. 1.

FIG. 5 is a simulation result of equivalent resistance values under different modes of the data writing capability enhancement system 100. X-axis represents node indices. Y-axis represents the equivalent resistance (Ohms). The simulation result of the equivalent bit line resistances at different nodes A to F is represented by C1 when the enhancement circuit 13 is turned off (i.e., without using a voltage boosting function). The simulation result of the equivalent source line resistances at different nodes A to F is represented by C2 when the enhancement circuit 13 is turned off (i.e., without using the voltage boosting function). The simulation result of the equivalent bit line resistances at different nodes A to F is represented by C3 when the enhancement circuit 13 is turned on (i.e., using the voltage boosting function). The simulation result of the equivalent source line resistances at different nodes A to F is represented by C4 when the enhancement circuit 13 is turned on (i.e., using the voltage boosting function). As shown in the simulation results C1 and C3 in FIG. 5, when the enhancement circuit 13 is turned on, the equivalent bit line resistances at different nodes A to F can be significantly reduced due to the execution of the voltage boosting function. Similarly, as shown in the simulation results C2 and C4 in FIG. 5, when the enhancement circuit 13 is turned on, the equivalent source line resistances at different nodes A to F can be significantly reduced due to the execution of the voltage boosting function.

Figure 6:
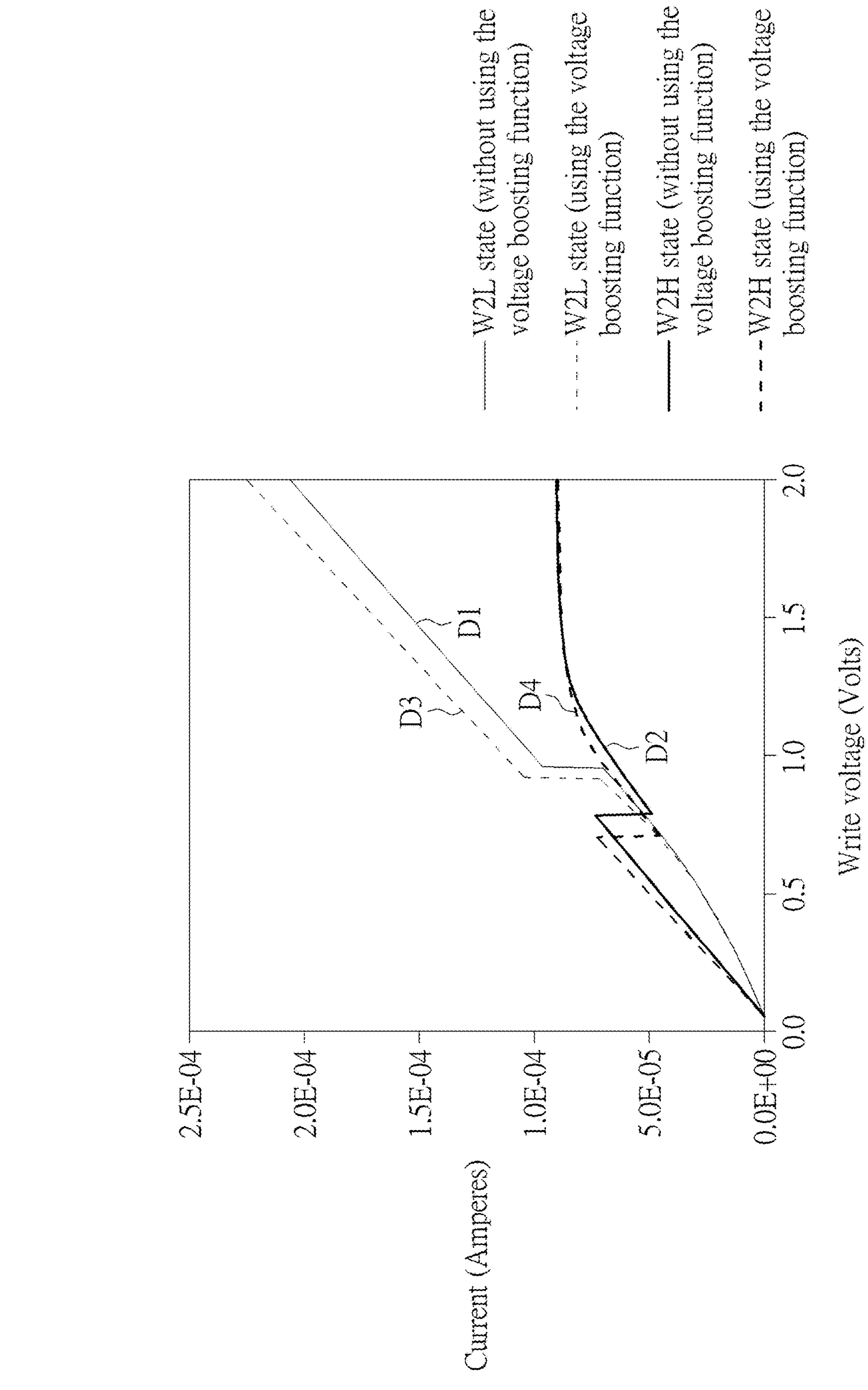
FIG. 6 is a simulation result of a write voltage and a current under different modes of the data writing capability enhancement system in FIG. 1.

FIG. 6 is a simulation result of a write voltage and a current under different modes of the data writing capability enhancement system 100. X-axis represents a write voltage, denoted as a high voltage Vwr (Volts). Y-axis represents a current (Amperes). The simulation result of the voltage-current correlation in the W2L state is represented by D1 when the enhancement circuit 13 is turned off (i.e., without using the voltage boosting function). The simulation result of the voltage-current correlation in the W2H state is represented by D2 when the enhancement circuit 13 is turned off (i.e., without using the voltage boosting function). The simulation result of the voltage-current correlation in the W2L state is represented by D3 when the enhancement circuit 13 is turned on (i.e., using the voltage boosting function). The simulation result of the voltage-current correlation in the W2H state is represented by D4 when the enhancement circuit 13 is turned on (i.e., using the voltage boosting function). As shown in the simulation results D3 and D1 in FIG. 6, when the enhancement circuit 13 is turned on, a smaller write voltage is required to enter the W2L state due to the execution of the voltage boosting function. Similarly, as shown in the simulation results D4 and D2 in FIG. 6, when the enhancement circuit 13 is turned on, a smaller write voltage is required to enter the W2H state due to the execution of the voltage boosting function. In other words, when the enhancement circuit 13 is turned on, the speed of entering the W2H or W2L state can be increased.

Figure 7:
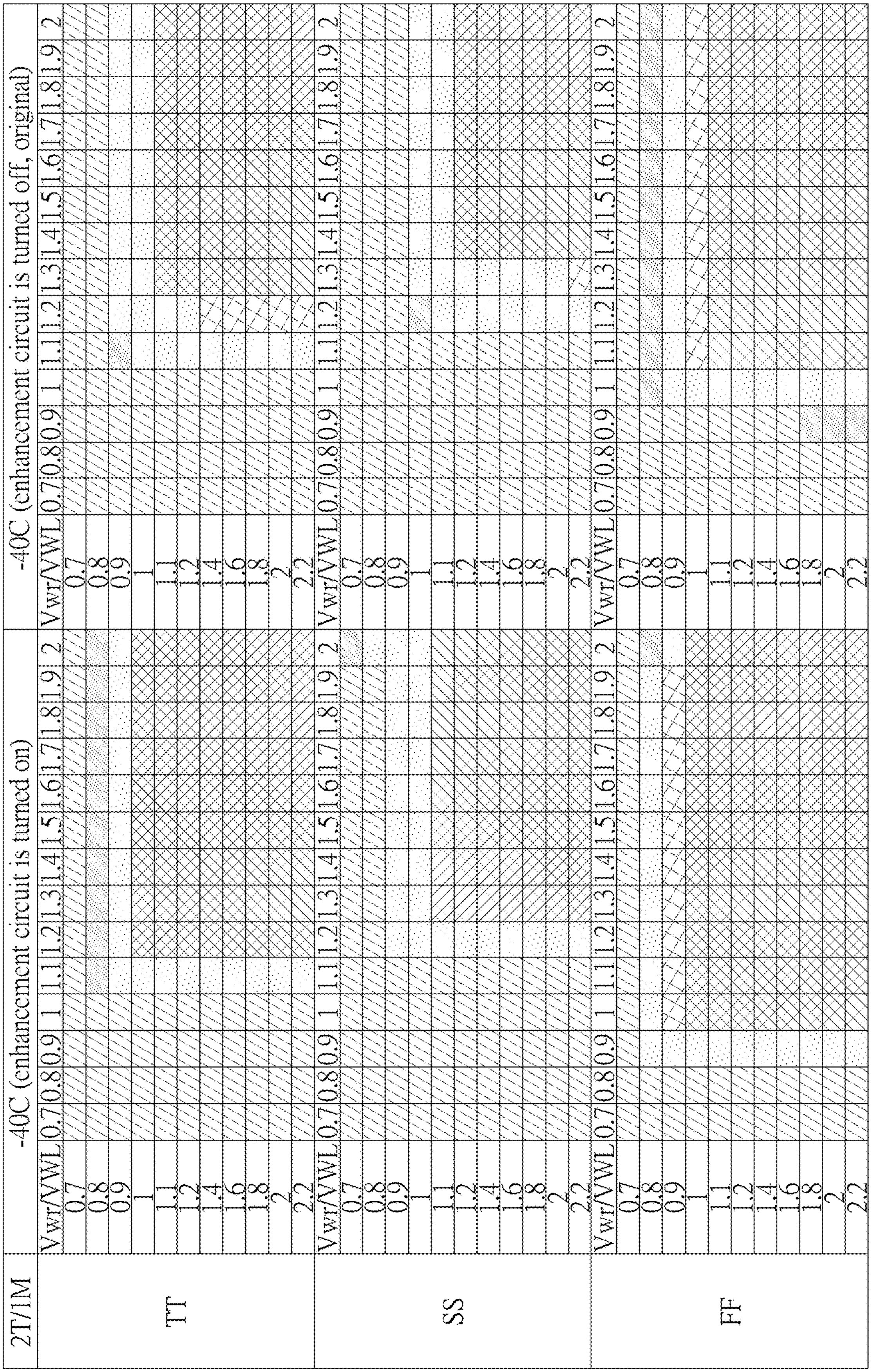
FIG. 7 is an illustration of write operation margins at low temperatures under different process corners and different modes of the data writing capability enhancement system in FIG. 1.

FIG. 7 is an illustration of write operation margins at low temperatures under different process corners and different modes of the data writing capability enhancement system 100. In FIG. 7, the process corners include Typical-Typical (TT), Slow-Slow (SS), and Fast-Fast (FF) configurations. It should be understood that, in order to comprehensively consider the reliability of the memory cell 10*a* in any process corner configuration, the write operation margin of the memory cell 10*a* will be dominated by the Slow-Slow configuration with poorer operating conditions. In FIG. 7, at a low temperature of −40 degrees Celsius, when the enhancement circuit 13 is turned on, the memory cell 10*a* can enter a large write operation margin. The large write operation margin can be defined by a boundary of the write voltage (represented by the high voltage Vwr) greater than or equal to 1.1 volts and a boundary of the word line voltage VWL greater than or equal to 1.3 volts. However, at the low temperature of −40 degrees Celsius, when the enhancement circuit 13 is turned off (i.e., the original MRAM), the memory cell 10*a* can enter a small write operation margin. The small write operation margin can be defined by a boundary of the write voltage (represented by the high voltage Vwr) greater than or equal to 1.2 volts and a boundary of the word line voltage VWL greater than or equal to 1.4 volts. Therefore, when the enhancement circuit 13 is turned on, the write operation margin of the memory cell 10*a* can be expanded.

To sum up, the present invention discloses a data writing capability enhancement system. The writing capability enhancement system can be applied to the MRAM. The data writing capability enhancement system introduces an enhancement circuit, which effectively reduces the equivalent resistance of each memory cell under different write states, thereby improving data writing efficiency. Moreover, the enhancement circuit provides source line compensation voltages and bit line compensation voltages, allowing the memory cells to receive compensation voltages for mitigating the IR drop, thereby reducing the requirements for write voltage. Further, the data writing capability enhancement system of the present invention offers several advantages. First, it improves the write efficiency by diminishing the equivalent internal resistance and voltage drop, thus accelerating write speed. Second, it can expand the write operation margin, ensuring robust write performance across various process corners and low-temperature conditions. Third, it curbs power consumption by reducing the requisite write voltage, thereby accelerating the transition into different write states (W2H or W2L).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory system comprising:

a magnetoresistive random access memory array comprising a plurality of word lines;

a first driving circuit coupled to the plurality of word lines of the magnetoresistive random access memory array and configured to provide a plurality of word line voltages to the plurality of word lines;

a second driving circuit coupled to one side of the magnetoresistive random access memory array and configured to provide a plurality of source line voltages and a plurality of bit line voltages to the side of the magnetoresistive random access memory array; and an enhancement circuit coupled to the other side of the magnetoresistive random access memory array and configured to provide a plurality of source line compensation voltages and a plurality of bit line compensation voltages to the other side of the magnetoresistive random access memory array.

2. The system of claim 1, wherein the magnetoresistive random access memory array comprises the plurality of word lines, a plurality of source lines, and a plurality of bit lines, the plurality of word lines are configured to receive the plurality of word line voltages generated by the first driving circuit, first source line terminals at a first side of the plurality of source lines are configured to receive the plurality of source line voltages generated by the second driving circuit, and first bit line terminals at a first side of the plurality of bit lines are configured to receive the plurality of bit line voltages generated by the second driving circuit.

3. The system of claim 2, wherein second source line terminals at a second side of the plurality of source lines are configured to receive the plurality of source line compensation voltages generated by the enhancement circuit, and second bit line terminals at a second side of the plurality of bit lines are configured to receive the plurality of bit line compensation voltages generated by the enhancement circuit.

4. The system of claim 3, wherein an equivalent source line resistance value at a source line node of each source line of the plurality of source lines is smaller than a total equivalent source line resistance of a plurality of memory cells on a row of the magnetoresistive random access memory array.

5. The system of claim 3, wherein an equivalent bit line resistance value at a bit line node of each bit line of the plurality of bit lines is smaller than a total equivalent bit line resistance of a plurality of memory cells on a row of the magnetoresistive random access memory array.

6. The system of claim 1, wherein the magnetoresistive random access memory array comprises a plurality of memory cells, a memory cell of the plurality of memory cells receives a source line voltage and a source line compensation voltage through a source line, and the memory cell receives a bit line voltage and a bit line compensation voltage through a bit line.

7. The system of claim 6, wherein when the source line voltage and the source line compensation voltage are high voltages and the bit line voltage and the bit line compensation voltage are low voltages, the memory cell is operated under a first write state.

8. The system of claim 6, wherein when the source line voltage and the source line compensation voltage are low voltages and the bit line voltage and the bit line compensation voltage are high voltages, the memory cell is operated under a second write state.

9. The system of claim 1, wherein the enhancement circuit is controlled by an enabling signal and an inverted enabling signal, the plurality of source line voltages are substantially equal to corresponding source line compensation voltages, and the plurality of bit line voltages are substantially equal to corresponding bit line compensation voltages.

10. The system of claim 1, wherein the magnetoresistive random access memory array comprises a plurality of memory cells, each memory cell of the plurality of memory cells comprises:

a first transistor comprising:

a first transistor first terminal coupled to a source line;

a first transistor second terminal; and a first transistor control terminal coupled to a word line of the plurality of word lines;

a second transistor comprising:

a second transistor first terminal coupled to the source line;

a second transistor second terminal coupled to the first transistor second terminal; and a second transistor control terminal coupled to the word line; and a magnetic tunnel junction component comprising:

a magnetic tunnel junction first terminal coupled to the second transistor second terminal; and a magnetic tunnel junction second terminal coupled to a bit line;

wherein the first transistor and the second transistor are N-type metal oxide semiconductor field effect transistors.

11. The system of claim 10, wherein a first source line terminal at a first side of the source line receives a source line voltage, a second source line terminal at a second side of the source line receives a source line compensation voltage, a first bit line terminal at a first side of the bit line receives a bit line voltage, and a second bit line terminal at a second side of the bit line receives a bit line compensation voltage.

12. The system of claim 11, wherein when the source line voltage and the source line compensation voltage are high voltages and the bit line voltage and the bit line compensation voltage are low voltages, a current is transmitted from the source line to the magnetic tunnel junction second terminal through the magnetic tunnel junction first terminal.

13. The system of claim 11, wherein when the source line voltage and the source line compensation voltage are low voltages and the bit line voltage and the bit line compensation voltage are high voltages, a current is transmitted from the bit line to the magnetic tunnel junction first terminal through the magnetic tunnel junction second terminal.

14. The system of claim 10, wherein the enhancement circuit comprises a plurality of source line enhancement units and a plurality of bit line enhancement units, a source line enhancement unit of the plurality of source line enhancement units is coupled to the source line, and a bit line enhancement unit of the plurality of bit line enhancement units is coupled to the bit line.

15. The system of claim 14, wherein the source line enhancement unit comprises:

a third transistor comprising:

a third transistor first terminal configured to receive a source line compensation voltage;

a third transistor second terminal coupled to the source line; and a third transistor control terminal configured to receive an inverted enabling signal; and a fourth transistor comprising:

a fourth transistor first terminal coupled to the third transistor first terminal;

a fourth transistor second terminal coupled to the third transistor second terminal; and a fourth transistor control terminal configured to receive the inverted enabling signal;

wherein the third transistor is an N-type metal oxide semiconductor field effect transistor, and the fourth transistor is a P-type metal oxide semiconductor field effect transistor.

16. The system of claim 15, wherein when the inverted enabling signal is at a low voltage, the fourth transistor is turned on, the third transistor is turned off, the source line compensation voltage is at a high voltage, and the source line compensation voltage is transmitted to a second source line terminal at a second side of the source line through the fourth transistor.

17. The system of claim 15, wherein when the inverted enabling signal is at a high voltage, the fourth transistor is turned off, the third transistor is turned on, the source line compensation voltage is at a low voltage, and the source line compensation voltage is transmitted to a second source line terminal at a second side of the source line through the third transistor.

18. The system of claim 14, wherein the bit line enhancement unit comprises:

a fifth transistor comprising:

a fifth transistor first terminal configured to receive a bit line compensation voltage;

a fifth transistor second terminal coupled to the bit line; and a fifth transistor control terminal configured to receive an enabling signal; and a sixth transistor comprising:

a sixth transistor first terminal coupled to the fifth transistor first terminal;

a sixth transistor second terminal coupled to the fifth transistor second terminal; and a sixth transistor control terminal configured to receive the enabling signal;

wherein the fifth transistor is an N-type metal oxide semiconductor field effect transistor, and the sixth transistor is a P-type metal oxide semiconductor field effect transistor.

19. The system of claim 18, wherein when the enabling signal is at a low voltage, the fifth transistor is turned off, the sixth transistor is turned on, the bit line compensation voltage is at a high voltage, and the bit line compensation voltage is transmitted to a second bit line terminal at a second side of the bit line through the sixth transistor.

20. The system of claim 18, wherein when the enabling signal is at a high voltage, the fifth transistor is turned on, the sixth transistor is turned off, the bit line compensation voltage is at a low voltage, and the bit line compensation voltage is transmitted to a second bit line terminal at a second side of the bit line through the fifth transistor.

* * * * *